United States Patent
Park et al.

(10) Patent No.: US 7,144,680 B2
(45) Date of Patent: Dec. 5, 2006

(54) ELECTRON BEAM LITHOGRAPHY METHOD USING NEW MATERIAL

(75) Inventors: Jong-bong Park, Osan-si (KR); Chel-jong Choi, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/220,697

(22) Filed: Sep. 8, 2005

(65) Prior Publication Data
US 2006/0141396 A1    Jun. 29, 2006

(30) Foreign Application Priority Data
Dec. 24, 2004    (KR) .................... 10-2004-0112299

(51) Int. Cl.
*G03C 5/00*    (2006.01)
(52) U.S. Cl. ..................... 430/296; 430/942
(58) Field of Classification Search ............... 430/296, 430/942
See application file for complete search history.

(56) References Cited

U.S. PATENT DOCUMENTS 5,926,360 A * 7/1999 Laibowitz et al. ....... 361/321.4
6,998,712 B1 * 2/2006 Okada et al. ............... 257/758

OTHER PUBLICATIONS

Das, Suman; "Physical Aspects of Process Control in Selective Laser Sintering of Metals", Advanced Engineering Materials 2003, 5, No. 10, pp. 701-711.*

* cited by examiner

*Primary Examiner*—Christopher G. Young

(57) ABSTRACT

An electron beam (EB) lithography method using a new material is provided. The method includes forming a thin layer using a Pb-based material; and patterning the thin layer by partially volatilizing the thin layer by irradiating electron beams. In this method, the thin layer formed of the Pb-based material is patterned using e-beams so that the linewidth of patterns formed on the thin layer can be greatly reduced.

20 Claims, 4 Drawing Sheets

ELECTRON BEAM LITHOGRAPHY METHOD USING NEW MATERIAL

CROSS-REFERENCE TO RELATED PATENT APPLICATION

This application claims the benefit of Korean Patent Application No. 10-2004-0112299, filed on Dec. 24, 2004, in the Korean Intellectual Property Office, the disclosure of which is incorporated herein in its entirety by reference.

BACKGROUND OF THE DISCLOSURE

1. Field of the Invention

The disclosure relates to an electron beam (EB) lithography method, more particularly, to an EB lithography method using a new material.

2. Description of the Related Art

An electron beam (EB) lithography process is used to delineate a circuit pattern during the fabrication of a semiconductor integrated circuit (IC). In general, a lithography process includes transferring a mask pattern onto a photoresist; and etching an underlying layer using a pattern of the transferred photoresist. The process of transferring the mask pattern has primarily been performed using light (especially ultraviolet (UV) rays). However, as the integration density and capacity of semiconductor devices increase, techniques of reducing the linewidth of patterns have rapidly been developed. For example, in a UV-photolithography process as a conventional fine processing technique, since the resolution and comformability of patterns are limited to 1 μm and ±3 μm, respectively, it becomes difficult to reduce the linewidth of the patterns to a sufficient degree. Accordingly, a variety of techniques and apparatuses have recently been developed in order to form patterns with a fine linewidth, and thus the advancement of related applications has been accelerated. As a result, not only far infrared (FIR) rays, but also electron beams (e-beams), x-rays, ion beams, and laser beams have been developed and utilized as energy sources.

Also, a conventional EB lithography technique has been used as one of methods for forming patterns with a fine linewidth of 0.1 μm or less. In general, this EB lithography technique includes coating a photoresist on a substrate; partially exposing the photoresist by scanning electron rays at high speed through a predetermined mask layer; and forming a photoresist pattern by performing a developing process. However, the conventional EB lithography technique is reaching the technical limit for forming finer patterns. For example, in the case of 193-nm ArF lithography, the linewidth of patterns is limited to about 45 nm, whereas in the case of SEM lithography, the linewidth of patterns is limited to about 30 nm. Therefore, in order to fabricate a more highly integrated larger-capacity semiconductor device, it is necessary to further reduce the linewidth of patterns using a lithography process.

SUMMARY OF THE DISCLOSURE

The present invention may provide an electron beam (EB) lithography method using a new material, which can further reduce the linewidth of patterns as compared to conventional methods.

According to an aspect of the present invention, there may be provided an EB lithography method including forming a thin layer using a Pb-based material; and patterning the thin layer by partially volatilizing the thin layer by irradiating electron beams (e-beams).

The Pb-based material may be one of Pb, PbO, and PbTi.

The thin layer may be patterned using an EB apparatus with an EB source and a condenser lens. The EB apparatus may be a transmission electron microscope (TEM) apparatus.

According to another aspect of the present invention, there is provided an EB lithography method including preparing a substrate; forming a thin layer by depositing a Pb-based material on the substrate; obtaining the thin layer by removing the substrate; and patterning the thin layer by partially volatilizing the thin layer by irradiating e-beams.

The thin layer may be formed using one of physical vapor deposition (PVD) or chemical vapor deposition (CVD).

The thin layer may be formed to a thickness of less than about 100 nm such that the e-beams transmit the thin layer.

The Pb-based material may be one of Pb, PbO, and PbTi.

The substrate may be formed of one of polycarbonate and sodium chloride (NaCl).

If the substrate is a polycarbonate substrate, the thin layer may be obtained by removing the substrate using chloroform, and if the substrate is a sodium chloride substrate, the thin layer may be obtained by removing the substrate using water.

The thin layer may be patterned using an EB apparatus with an EB source and a condenser lens. The EB apparatus may be a TEM apparatus.

According to yet another aspect of the present invention, there is provided an EB lithography method including preparing a substrate; forming a Pb-based material layer by depositing a Pb-based material on the substrate to a predetermined thickness; forming a thin layer by severing the Pb-based material layer and the substrate in a direction normal to a surface of the substrate; and patterning the thin layer by partially volatilizing the thin layer by irradiating e-beams.

The Pb-based material layer may be formed using one of PVD and CVD.

The Pb-based material layer may be formed to a thickness of about 1 to about 100 μm.

The Pb-based material may be one of Pb, PbO, and PbTi.

The thin layer may be formed by severing the Pb-based material layer and the substrate in the direction normal to a surface of the substrate using a focused ion beam (FIB) apparatus.

The thin layer may be formed to a thickness of less than about 100 nm such that the e-beams transmit the thin layer.

The thin layer may be patterned using an EB apparatus with an EB source and a condenser lens. The EB apparatus may be a TEM apparatus.

According to the EB lithography method of the present invention, a thin layer formed of a Pb-based material is patterned using e-beams, so that the linewidth of patterns can be further reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1A:
FIGS. 1A through 1C are cross-sectional views illustrating an electron beam (EB) lithography method according to an exemplary embodiment of the present invention.

The present invention will now be described more fully hereinafter with reference to the accompanying drawings, in which exemplary embodiments of the invention are shown. In the drawings, the same reference numerals are used to denote the same elements, and the thicknesses of layers and regions are exaggerated for clarity.

Figure 1B:
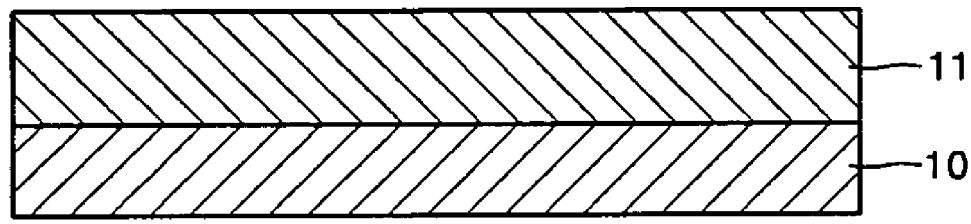
Figure 1C:

FIGS. 1A through 1C are cross-sectional views illustrating an electron beam (EB) lithography method according to an exemplary embodiment of the present invention.

Referring to FIG. 1A, a substrate 10 is prepared. In the present embodiment, the substrate 10 is removed before a patterning process is performed on a thin layer. Thus, the substrate 10 may be formed of a material that is easily removed using a physical or chemical technique. In the present embodiment, the substrate 10 may be formed of polycarbonate that is soluble in a chloroform solution. In another case, the substrate 10 may be formed of water-soluble sodium chloride (NaCl).

Thereafter, referring to FIG. 1B, a thin layer 11 is formed on the substrate 10 by depositing a Pb-based material. The Pb-based material may be deposited using physical vapor deposition (PVD) or chemical vapor deposition (CVD). In the present embodiment, the thin layer 11 will be patterned later using a transmission electron microscope (TEM) apparatus. Therefore, the thin layer 11 may be formed to such a thickness (e.g., less than about 100 nm) that electron beams (e-beams) can transmit the thin layer 11.

In the present embodiment, the thin layer 11 is formed of a Pb-based material, such as Pb, PbO, or PbTi. Since the Pb-based material volatilizes due to e-beams, it is possible to form a predetermined pattern on the thin layer 11 using the e-beams. In this respect, the EB lithography method according to the present invention utilizes the Pb-based material as a material for the thin layer 11.

Thereafter, referring to FIG. 1C, the substrate 10 is removed, thus obtaining only the thin layer 11. In the present embodiment, when the substrate 10 is formed of polycarbonate, the substrate 10 may be removed using chloroform, which is a solvent for polycarbonate. In another embodiment, when the substrate 10 is formed of sodium chloride (NaCl), the substrate 10 may be removed using water.

Subsequently, the thin layer 11 obtained by removing the substrate 10 is patterned in a TEM apparatus. As described above, since the thin layer 11 is formed of a Pb-based material that volatilizes due to e-beams, it can be patterned using e-beams produced from the TEM apparatus. In this process, the thin layer 11 can be fabricated as a mask used for a semiconductor fabrication process, or a circuit pattern required for the thin layer 11 can be directly formed. When the thin layer 11 is used for a mask, it is exposed to extreme ultraviolet (EUV) rays so that a pattern formed in the thin layer 11 can be transferred onto the substrate 10 using a lithography process.

Figure 2A:
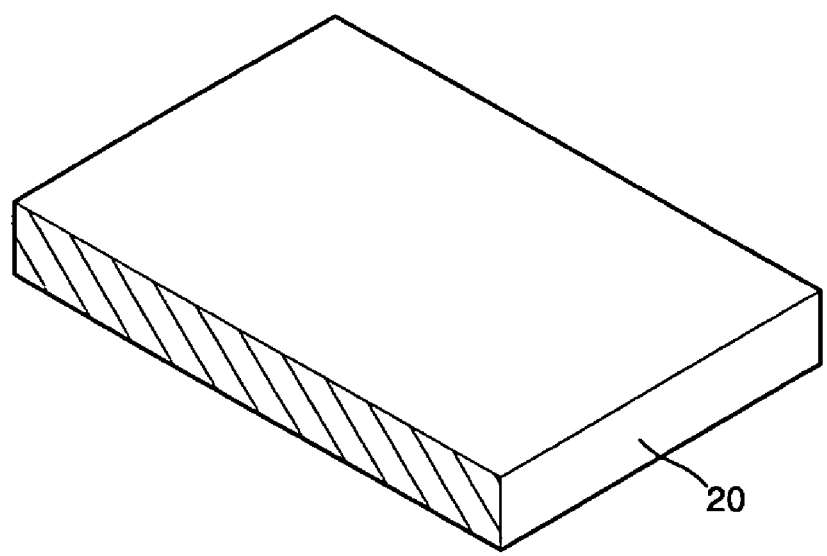
FIGS. 2A through 2C are perspective views illustrating an EB lithography method according to another exemplary embodiment of the present invention.
Figure 2B:
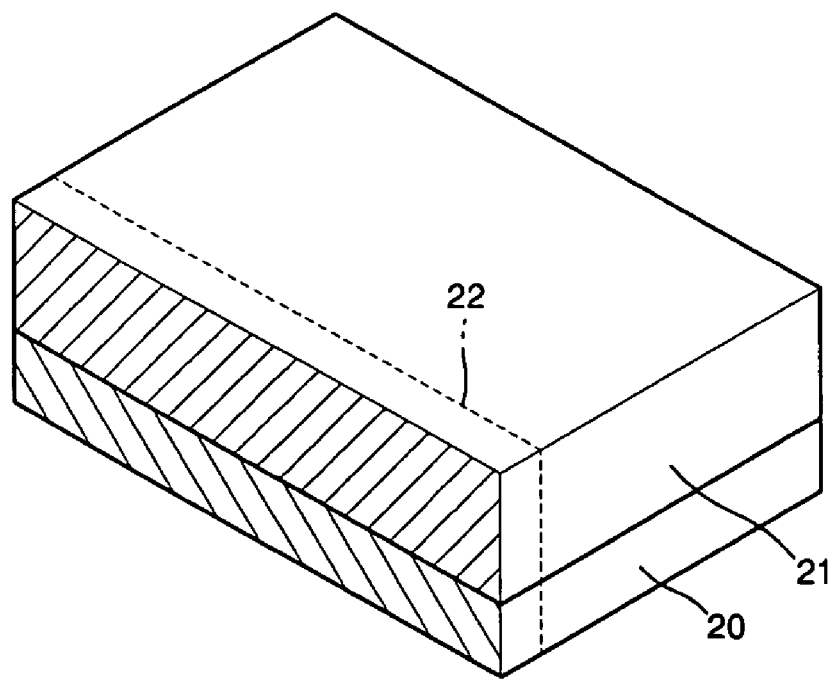
Figure 2C:
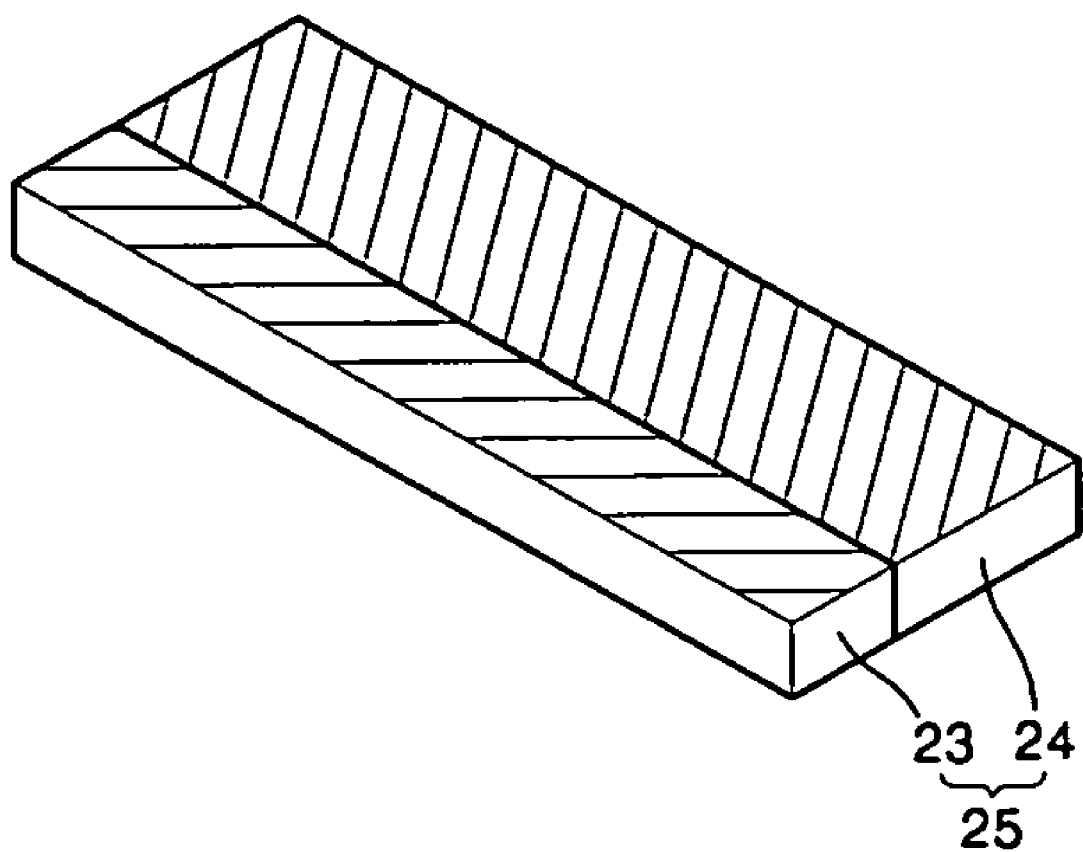

FIGS. 2A through 2C are perspective views illustrating an EB lithography method according to another exemplary embodiment of the present invention.

Referring to FIG. 2A, a substrate 20 is prepared. The substrate 20 may be formed of an ordinary material for a substrate, for example, silicon (Si).

After that, referring to FIG. 2B, a Pb-based material is deposited on the substrate 20, thereby forming a Pb-based material layer 21. The Pb-based material may be deposited using PVD or CVD. In the present embodiment, since the Pb-based material layer 21 is severed using a focused ion beam (FIB) apparatus, it may be formed to a thickness (e.g., about 1 to about 100 μm) that facilitates the severing process using the FIB apparatus. That is, the thickness of the Pb-based material layer 21 is appropriately controlled to easily sever the Pb-based material layer 21 using the FIB apparatus. For this reason, if the Pb-based material layer 21 is severed using another apparatus, its desired thickness may vary.

Also, the Pb-based material layer 21 is formed of a Pb-based material, such as Pb, PbO, or PbTi, which volatilizes due to the e-beams.

Thereafter, the Pb-based material layer 21 and the substrate 20 are severed along a severing line 22 using the FIB apparatus. In this case, the Pb-based material layer 21 and the substrate 20 may be severed to such a thickness (e.g., less than about 100 nm) that they can be patterned using a TEM apparatus. Although it is described in the present embodiment that the Pb-based material layer 21 and the substrate 20 are severed using the FIB apparatus, the present invention is not limited thereto. In other words, according to the EB lithography method of the present invention, the Pb-based material layer 21 and the substrate 20 may be severed using another apparatus yield to their required thicknesses.

Once the Pb-based material layer 21 and the substrate 20 are severed to a small thickness, a thin layer 25 can be obtained as shown in FIG. 2C. The thin layer 25 includes a Pb-based material thin layer 24 obtained from the Pb-based material layer 21 and a substrate thin layer 23 obtained from the substrate 20.

Thereafter, the Pb-based material thin layer 24 is patterned in the TEM apparatus. In this process, the Pb-based material thin layer 24 may be formed as a mask for a semiconductor fabrication process, or a circuit pattern required for the Pb-based material thin layer 24 may be directly patterned. When the Pb-based material thin layer 24 is used as a mask, the thin layer 24 is exposed to EUV rays so that a pattern formed in the thin layer 24 can be transferred to the substrate 20 using a lithography process.

It is described in the above-described embodiments that the Pb-based material layer is patterned using the TEM apparatus, but the present invention is not limited thereto. According to the EB lithography method of the present invention, the Pb-based material layer can be patterned using another apparatus including an e-beam source and a condenser lens for condensing e-beams produced from the e-beam source.

Figure 3:
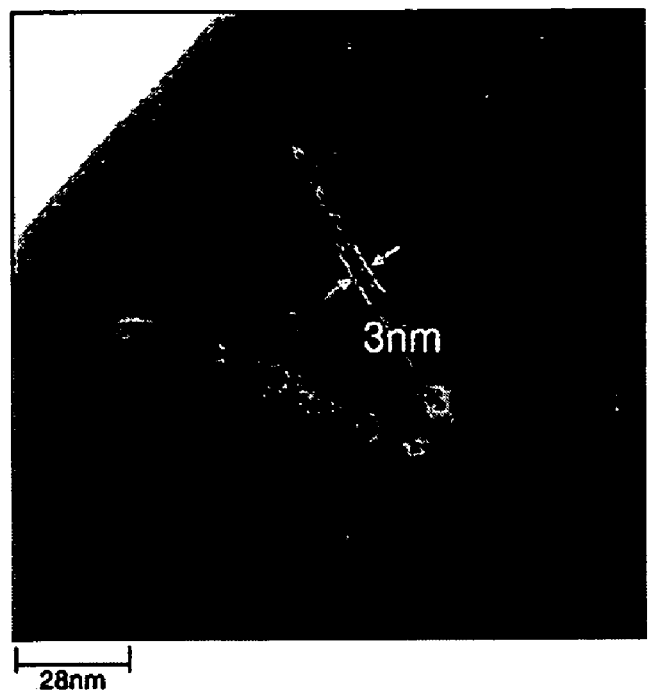
FIG. 3 is an exemplary transmission electron microscope (TEM) photograph of the resultant structure that may be obtained by an EB lithography method according to the present invention.
Figure 4:
FIG. 4 is a scanning TEM (STEM) photograph of an exemplary resultant structure that may be obtained by an EB lithography method according to the present invention.

FIG. 3 is a TEM of an exemplary resultant structure that may be obtained by an EB lithography method according to the present invention, and FIG. 4 is a scanning TEM (STEM) of an exemplary resultant structure that may be obtained by an EB lithography method according to the present invention. The present example is conducted according to the first embodiment and includes the following processes.

In the present example, PbTi is used as a Pb-based material. At the outset, PbTi is deposited on a polycarbonate substrate using a metal organic CVD (MOCVD). After that, the polycarbonate substrate is removed using a chloroform solution, thereby fabricating a sample for the present experiment.

Thereafter, the sample is loaded into a TEM apparatus, and the TEM apparatus is converted into an STEM mode. The TEM apparatus is modulated in accordance with the intensity of e-beams and the size of the e-beam probe. In the present embodiment, the TEM apparatus has an acceleration voltage of 200 kV and produces e-beams at the wavelength of 0.0251 Å. After that, the sample is patterned in the STEM mode. Here, once the intensity of the e-beams and the size of the e-beam probe are determined, the linewidth of the patterns formed on the sample is determined. Also, the time to irradiate e-beams onto the sample is determined upon a consideration of the intensity of e-beams, the size of the e-beam probe, and the thickness of the sample.

Subsequently, an STEM photograph of the patterned sample is taken. After the TEM apparatus is converted into the TEM mode, a TEM photograph of the same sample is taken.

The resultant structures obtained from the above-described process are shown in FIGS. 3 and 4.

Referring to FIGS. 3 and 4, according to the EB lithography method of the present invention, fine patterns of about 3 nm can be formed on a PbTi thin layer. In conclusion, the linewidth of the patterns formed on the thin layer can be greatly reduced.

According to the EB lithography method as described above, a thin layer formed of a Pb-based material is patterned using e-beams, so that the linewidth of patterns formed on the thin layer can be greatly reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electron beam lithography method comprising:
   forming a thin layer using a Pb-based material; and
   patterning the thin layer by partially volatilizing the thin layer by irradiating electron beams.

2. The method of claim 1, wherein the Pb-based material is one selected from the group consisting of Pb, PbO, and PbTi.

3. The method of claim 1, wherein the patterning of the thin layer is performed using an electron beam apparatus with an electron beam source and a condenser lens.

4. The method of claim 3, wherein the electron beam apparatus is a transmission electron microscope (TEM) apparatus.

5. An electron beam lithography method comprising:
   preparing a substrate;
   forming a thin layer by depositing a Pb-based material on the substrate;
   obtaining the thin layer by removing the substrate; and
   patterning the thin layer by partially volatilizing the thin layer by irradiating electron beams.

6. The method of claim 5, wherein the forming of the thin layer is performed using physical vapor deposition (PVD) or chemical vapor deposition (CVD).

7. The method of claim 5, wherein the thin layer is formed to a thickness of less than about 100 nm.

8. The method of claim 5, wherein the Pb-based material is one selected from the group consisting of Pb, PbO, and PbTi.

9. The method of claim 5, wherein the substrate is formed of polycarbonate or sodium chloride (NaCl).

10. The method of claim 9, wherein the obtaining of the thin layer includes removing the substrate using chloroform if the substrate is a polycarbonate substrate,
    and the obtaining of the thin layer includes removing the substrate using water if the substrate is a sodium chloride substrate.

11. The method of claim 5, wherein the patterning of the thin layer is performed using an electron beam apparatus with an electron beam source and a condenser lens.

12. The method of claim 11, wherein the electron beam apparatus is a transmission electron microscope (TEM) apparatus.

13. An electron beam lithography method comprising:
    preparing a substrate;
    forming a Pb-based material layer by depositing a Pb-based material on the substrate to a predetermined thickness;
    forming a thin layer by severing the Pb-based material layer and the substrate in a direction normal to a surface of the substrate; and
    patterning the thin layer by partially volatilizing the thin layer by irradiating electron beams.

14. The method of claim 13, wherein the forming of the Pb-based material layer is performed using physical vapor deposition (PVD) or chemical vapor deposition (CVD).

15. The method of claim 13, wherein the Pb-based material layer is formed to a thickness of about 1 to about 100 µm.

16. The method of claim 13, wherein the Pb-based material is one selected from the group consisting of Pb, PbO, and PbTi.

17. The method of claim 13, wherein the forming of the thin layer includes severing the Pb-based material layer and the substrate in a direction normal to a surface of the substrate using a focused ion beam (FIB) apparatus.

18. The method of claim 13, wherein the thin layer is formed to a thickness of less than about 100 nm.

19. The method of claim 13, wherein the patterning of the thin layer is performed using an electron beam apparatus with an electron beam source and a condenser lens.

20. The method of claim 19, wherein the electron beam apparatus is a transmission electron microscope (TEM) apparatus.

* * * * *